United States Patent
Kang et al.

(10) Patent No.: US 12,532,590 B2
(45) Date of Patent: Jan. 20, 2026

(54) DISPLAY DEVICE

(71) Applicant: Samsung Display Co., Ltd., Yongin-si (KR)

(72) Inventors: Hoon Kang, Yongin-si (KR); Woongsik Kim, Hwaseong-si (KR); Sanghyun Yun, Sejong-si (KR); Yang-Ho Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1130 days.

(21) Appl. No.: 17/362,714

(22) Filed: Jun. 29, 2021

(65) Prior Publication Data
US 2022/0069001 A1    Mar. 3, 2022

(30) Foreign Application Priority Data

Aug. 27, 2020  (KR) .......................... 10-2020-0108425

(51) Int. Cl.
| | |
|---|---|
| *H10H 29/14* | (2025.01) |
| *H10H 20/825* | (2025.01) |
| *H10H 20/851* | (2025.01) |
| *H10H 20/857* | (2025.01) |

(52) U.S. Cl.
CPC ........ *H10H 29/142* (2025.01); *H10H 20/825* (2025.01); *H10H 20/8512* (2025.01); *H10H 20/857* (2025.01)

(58) Field of Classification Search
CPC ............... H10H 29/142; H10H 20/825; H10H 20/8512; H10H 20/857; H10H 20/855; H10H 20/853; H10H 20/8513; H10H 20/84; H10H 20/8515; H10H 20/8511; H01L 25/0753; H01L 25/167; H01L 25/162; G09F 9/33
See application file for complete search history.

(56) References Cited

U.S. PATENT DOCUMENTS

| | | | |
|---|---|---|---|
| 7,196,465 B2 | 3/2007 | Park et al. | |
| 7,279,715 B2 | 10/2007 | Park et al. | |
| 7,385,348 B2 | 6/2008 | Park et al. | |
| 9,887,184 B2 | 2/2018 | Takeya et al. | |
| 2018/0188579 A1 | 7/2018 | Jeong et al. | |
| 2019/0121176 A1* | 4/2019 | Lee .................. | G02F 1/133512 |

(Continued)

FOREIGN PATENT DOCUMENTS

| | | |
|---|---|---|
| EP | 3343274 A2 | 7/2018 |
| KR | 10-2009-0005450 A | 1/2009 |

(Continued)

OTHER PUBLICATIONS

EPO Extended Search Report dated Feb. 1, 2022, for corresponding European Patent Application No. 21191193.8 (8 pages).

*Primary Examiner* — Ratisha Mehta
(74) *Attorney, Agent, or Firm* — Womble Bond Dickinson (US) LLP (57) ABSTRACT

A display device including a plurality of sub-display panels, wherein each of the sub-display panels includes: a first substrate; a plurality of transistors on the first substrate; a capping member arranged along an edge of the first substrate to surround the transistors; a second substrate on the capping member and the transistors; and a plurality of light emitting elements on the second substrate and electrically connected to the transistors, respectively.

20 Claims, 8 Drawing Sheets

(56) References Cited

U.S. PATENT DOCUMENTS

| | | | |
|---|---|---|---|
| 2019/0131551 A1 | 5/2019 | Xie | |
| 2019/0198802 A1* | 6/2019 | Lee | H10K 59/38 |
| 2019/0244563 A1* | 8/2019 | Kishimoto | G09G 3/3225 |
| 2020/0044125 A1 | 2/2020 | Chen et al. | |
| 2020/0203453 A1* | 6/2020 | Kim | H10K 59/131 |
| 2020/0219937 A1* | 7/2020 | Ahn | H10K 59/8792 |
| 2021/0091260 A1* | 3/2021 | Ogawa | H10D 86/60 |
| 2023/0101638 A1* | 3/2023 | Di | H10H 20/8316 |
| | | | 257/79 |

FOREIGN PATENT DOCUMENTS

| | | |
|---|---|---|
| KR | 10-2016-0099999 A | 8/2016 |
| KR | 10-2018-0022683 A | 3/2018 |
| KR | 10-2067090 B1 | 1/2020 |
| KR | 10-2020-0030226 A | 3/2020 |
| KR | 10-2020-0047862 A | 5/2020 |

\* cited by examiner

DISPLAY DEVICE

CROSS-REFERENCE TO RELATED APPLICATION

The present application claims priority to and the benefit of Korean Patent Application No. 10-2020-0108425 filed on Aug. 27, 2020 in the Korean Intellectual Property Office (KIPO), the entire disclosure of which is incorporated herein by reference.

BACKGROUND

1. Field

Aspects of some embodiments of the present disclosure relate to a display device.

2. Description of the Related Art

Recently, as an interest in display devices has increased, various forms of display devices have been utilized. For example, as display devices become larger, display devices may be manufactured with a plurality of sub-display panels coupled to each other so as to be used as a single display panel.

As the sub-display panels of the display device are coupled to each other for use, a coupling area (e.g., a seam line, boundary between sub-display panels, etc.) at which the sub-display panels are coupled to each other may be visually perceived by users, which may reduce the display quality.

The above information disclosed in this Background section is only for enhancement of understanding of the background and therefore the information discussed in this Background section does not necessarily constitute prior art.

SUMMARY

Aspects of some embodiments of the present disclosure relate to a display device, and for example, to a display device including an inorganic light emitting material.

Aspects of some embodiments according to the present invention may include a display device with relatively improved visibility.

However, aspects of embodiments according to the present invention are not limited to the above-described characteristics, and may be variously extended without departing from the spirit and scope of embodiments according to the present invention.

According to some embodiments according to the present disclosure, a display device includes a plurality of sub-display panels, each of the sub-display panel may include a first substrate, a plurality of transistors on the first substrate, a capping member arranged along an edge of the first substrate to surround the transistors, a second substrate on the capping member and the transistors, and a plurality of light emitting elements on the second substrate and electrically connected to the transistors, respectively.

According to some embodiments, a part of the light emitting elements may overlap the capping member.

According to some embodiments, the light emitting elements may include an inorganic light emitting material.

According to some embodiments, the inorganic light emitting material may include gallium nitrate (GaN).

According to some embodiments, the first substrate and the second substrate may include polyimide.

According to some embodiments, the first substrate and the second substrate may include glass.

According to some embodiments, one substrate among the first substrate and the second substrates may include polyimide, and a remaining one substrate except for the one substrate may include glass.

According to some embodiments, each of the sub-display panels may further include a circuit board under the first substrate and including a driver.

According to some embodiments, the first substrate may include an opening area, and each of the sub-display panels may further include a conductive connection member at least partially in the opening area and configured to electrically connect the circuit board to the transistors.

According to some embodiments, the light emitting elements may emit a light having a same color.

According to some embodiments, each of the sub-display panels may further include a color conversion layer on the light emitting elements and including a color conversion part and a color compensation part, and a color filter layer on the color conversion layer.

According to some embodiments, the color conversion layer may include a wavelength conversion particle configured to excite an incident light to emit a light having a color that is different from a color of the incident light, and the color filter layer may be configured to filter the light emitted from the color conversion layer.

According to some embodiments, each of the sub-display panels may further include a third substrate on the color filter layer.

According to some embodiments, the third substrate may include polyimide.

According to some embodiments, the third substrate may includes glass.

According to some embodiments, the light emitting elements may emit lights having mutually different colors.

According to some embodiments, each of the sub-display panels may further include a third substrate on the light emitting elements.

According to some embodiments, the third substrate may include polyimide.

According to some embodiments, the third substrate may include glass.

According to some embodiments, each of the sub-display panels may further include an inorganic insulating layer between the first substrate and the transistors.

According to some embodiments, each of the sub-display panels may further include an inorganic insulating layer between the second substrate and the light emitting elements.

According to some embodiments, each of the first substrate and the second substrate may have a thickness of 2 to 10 micrometers.

According to some embodiments, the capping member may include at least one selected from a frit, an inorganic material, and glass.

According to some embodiments of the present invention, a display device may include: a first substrate; a second substrate on the first substrate; a plurality of elements (e.g., transistors, etc.) between the first substrate and the second substrate; and a plurality of light emitting elements on the second substrate and including an inorganic material. The display device may further include a capping member between the first substrate and the second substrate along edges of the elements.

Because the light emitting elements include the inorganic material, the light emitting elements can be relatively more resistant to moisture as compared with light emitting elements including an organic material. Accordingly, it may be unnecessary to arrange the capping member at edges of the light emitting elements including the inorganic material. Therefore, the light emitting elements including the inorganic material can be located in a relatively wider area as compared with the elements (e.g., an area overlapping the capping member), so that the display device can have a relatively wide display area.

However, characteristics of embodiments according to the present invention are not limited to the above effects, and may be variously extended without departing from the idea and scope of embodiments according to the present invention.

DETAILED DESCRIPTION

Hereinafter, aspects of some embodiments of the present invention will be described in more detail with reference to the accompanying drawings. The same reference numerals will be used for the same elements in the drawings, and some redundant descriptions of the same elements may be omitted.

Figure 1:
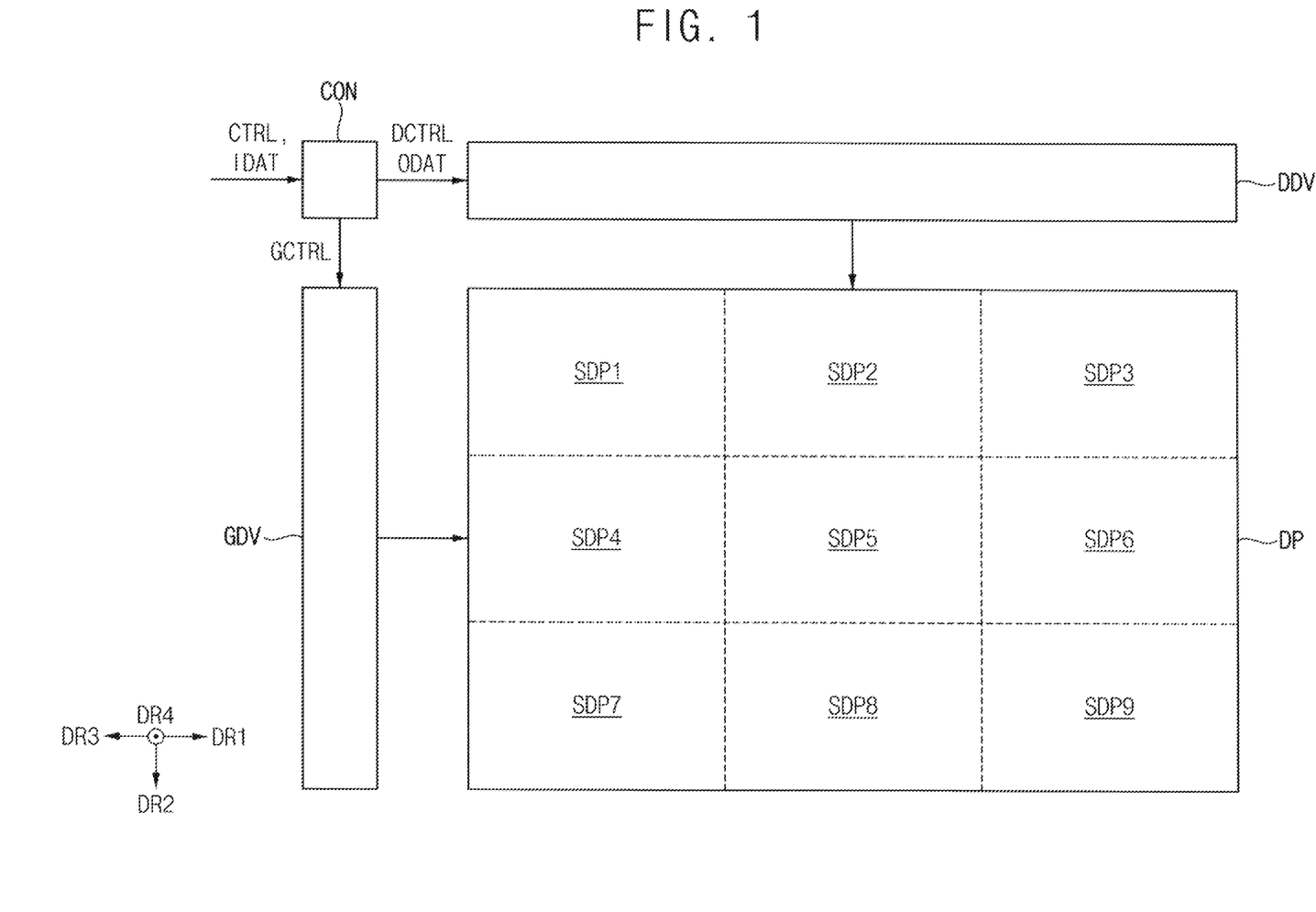
FIG. 1 is a plan view showing a display device according to some embodiments of the present invention.

FIG. 1 is a plan view showing a display device according to some embodiments of the present invention.

Referring to FIG. 1, the display device may include a display panel DP, a data driver DDV, a gate driver GDV, and a timing controller CON.

According to some embodiments, the display panel DP may include a plurality of sub-display panels. For example, the display panel DP may include a plurality of sub-display panels SDP1, SDP2, SDP3, SDP4, SDP5, SDP6, SDP7, SDP8, and SDP9 arranged in the form of a matrix. However, because the above configuration is provided for illustrative purposes, a configuration for arranging the sub-display panels is not limited thereto, and the display panel DP may include any suitable number or configuration of sub-display panels according to the design of the display panel DP. For example, the display panel DP may include first to $n^{th}$ sub-display panels (where n is a natural number of 2 or more). In addition, the display panel DP may include a plurality of sub-display panels arranged in one direction.

The display panel DP may include a plurality of pixel areas. Each of the pixel areas may include a pixel. The pixel may include a plurality of sub-pixels. The pixel may be connected to a light emitting structure. The display panel DP may display an image through the light emitting structure.

For example, the light emitting structure may include one of an organic light emitting diode (OLED), a quantum-dot organic light emitting diode (QDOLED), and a quantum-dot nano light emitting diode (QNED).

The timing controller CON may generate a gate control signal GCTRL, a data control signal DCTRL, and output image data ODAT based on a control signal CTRL and input image data IDAT provided from an outside. For example, the control signal CTRL may include a vertical synchronization signal, a horizontal synchronization signal, an input data enable signal, a master clock signal, and the like. For example, the input image data IDAT may be RGB data including red image data, green image data, and blue image data. Alternatively, the input image data IDAT may include magenta image data, cyan image data, and yellow image data.

The gate driver GDV may generate gate signals based on the gate control signal GCTRL provided from the timing controller CON. For example, the gate control signal GCTRL may include a vertical start signal, a clock signal, and the like.

The gate driver GDPV may be electrically connected to the display panel DP, and may sequentially output the gate signals. The pixels may receive a data voltage according to the control of the gate signals, respectively.

The data driver DDV may generate the data voltage based on the data control signal DCTRL and the output image data ODAT provided from the timing controller CON. For example, the data control signal DCTRL may include an output data enable signal, a horizontal start signal, a load signal, and the like.

The data driver DDV may be electrically connected to the display panel DP, and may generate a plurality of data voltages. Each of the pixels may transmit a signal for luminance corresponding to each of the data voltages to the light emitting structure.

Although the gate driver GDV and the data driver DDV have been shown in FIG. 1 as being located on a side surface of the display panel DP, embodiments according to the present disclosure are not limited thereto. For example, the gate driver GDV and the data driver DDV may be located on a rear surface of the display panel DP. In this case, the gate driver GDV and the data driver DDV may not be visually recognized or perceived by users at a front surface of the display device.

The gate driver GDV and the data driver DDV may be located on the side surface of the display panel DP. In such configurations, the display device may include a dead space that is a non-display area. According to the present invention, the gate driver GDV and the data driver DDV are located on the rear surface of the display panel DP, so that the dead space of the display device may be relatively reduced.

Figure 2:
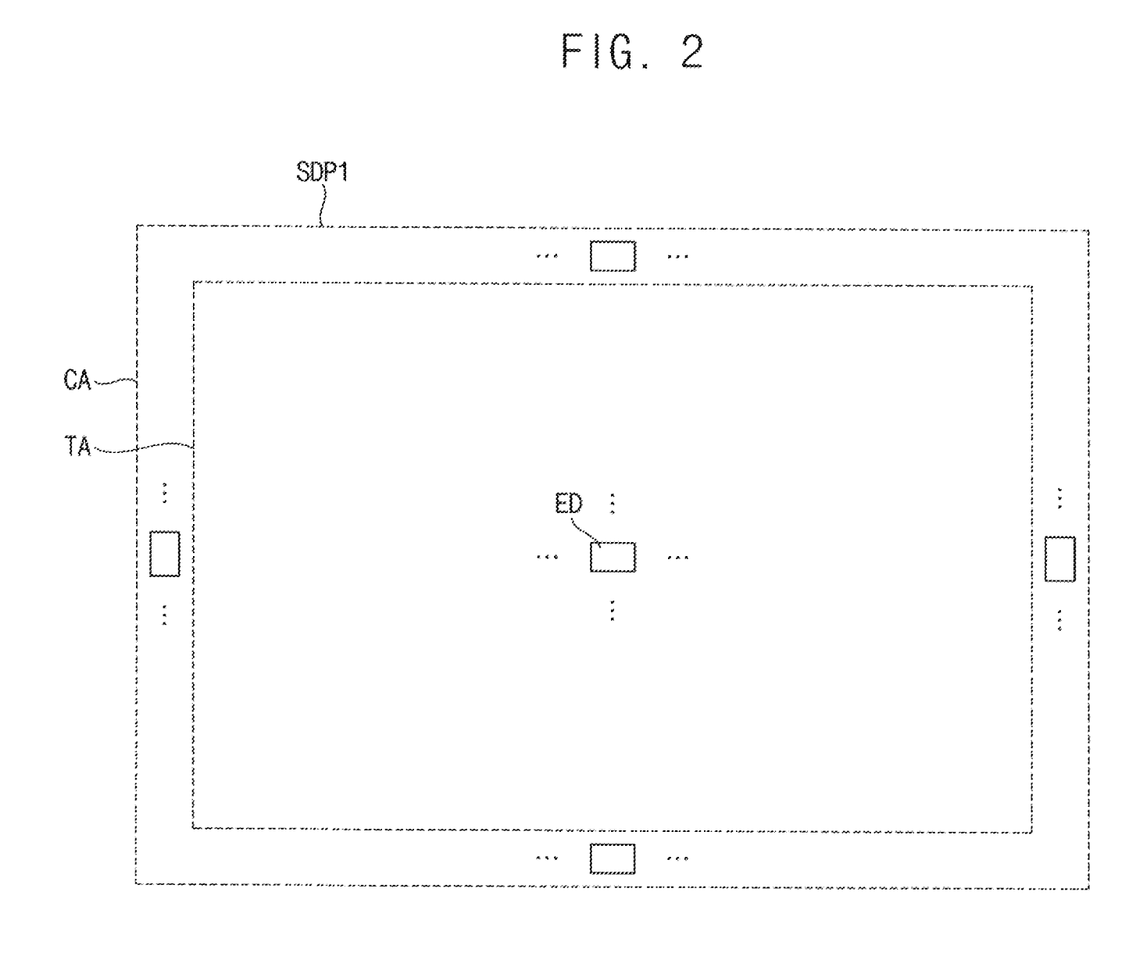
FIG. 2 is a plan view showing a sub-display panel included in the display device of FIG. 1 according to some embodiments of the present invention.

FIG. 2 is a plan view showing aspects of a sub-display panel included in the display device of FIG. 1 according to some embodiments.

Referring to FIG. 2, a first sub-display panel SDP1 may include a plurality of light emitting elements ED. The first sub-display panel SDP1 may include an element area TA in which elements (e.g., transistors, etc.) are located, and a capping area CA arranged along an edge of the element area TA. The capping area CA may be an area in which a capping member is located. Because the elements may be vulnerable to moisture other contaminants, the capping member may be utilized to prevent or reduce the moisture or other contaminants penetrating into the elements from side surfaces of the elements.

The light emitting elements ED may be located on the element area TA. For example, the light emitting elements ED may be located on the element area TA in the form of a matrix. In addition, the light emitting elements ED may be located at the capping area CA.

According to some embodiments of the present invention, the light emitting elements ED may include an inorganic light emitting material (e.g., gallium nitrate (GaN), etc.). Accordingly, the light emitting elements ED may not be easily damaged by moisture. Therefore, it is unnecessary to cap the light emitting elements ED from side surfaces of the light emitting elements ED. Accordingly, the light emitting elements ED may be located at the capping area CA, and the display device may ensure a wide display area.

According to some embodiments, the capping area CA of the first sub-display panel SDP1 may be coupled to a capping area of an adjacent sub-display panel while making contact with the capping area of the adjacent sub-display panel. Because the light emitting elements ED are able to be located in the capping area CA, a coupling area (e.g., a seam line, etc.) at which the sub-display panels are coupled to each other to cause visual recognition of the coupling area may not be visually recognized or perceived from the outside by users.

Figure 3:
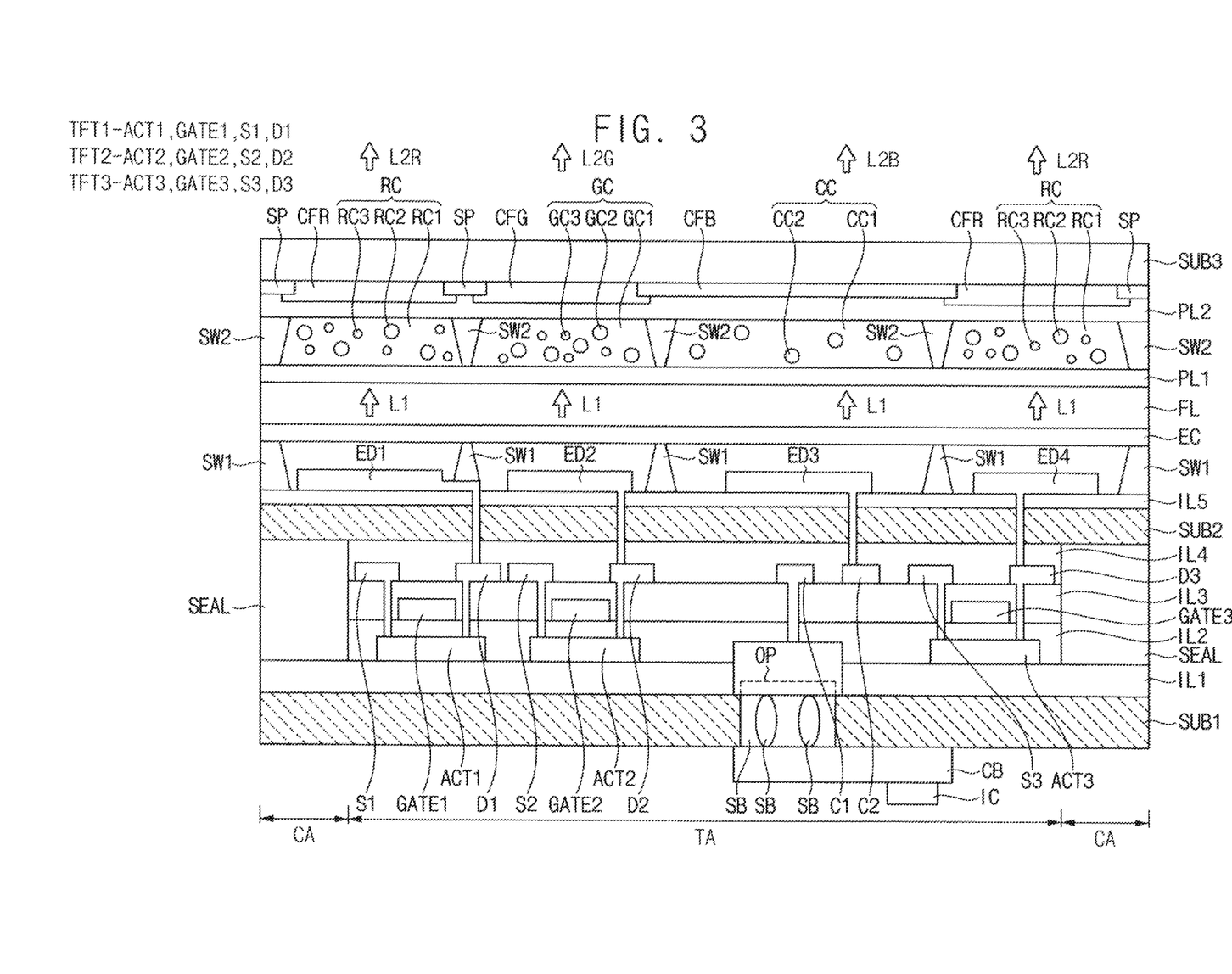
FIG. 3 is a sectional view showing a display device according to some embodiments of the present invention.

FIG. 3 is a sectional view showing further details of a display device according to some embodiments of the present invention. FIG. 3 is a sectional view showing a sectional shape of one of sub-display panels of FIG. 1.

Referring to FIG. 3, the display device may include a driver IC, a circuit board CB, a first substrate SUB1, a first insulating layer IL1, an anisotropic conductive film ACF, a pad PAD, a capping member SEAL, a first transistor TFT1, a second transistor TFT2, a third transistor TFT3, a second insulating layer IL2, a third insulating layer IL3, a fourth insulating layer IL4, a second substrate SUB2, a fifth insulating layer IL5, a first light emitting element ED1, a second light emitting element ED2, a third light emitting element ED3, a fourth light emitting element ED4, a first separation wall SW1, an encapsulation layer EC, a filling layer FL, a first protective layer PL1, a second separation wall SW2, a red conversion part RC, a green conversion part GC, a color compensation part CC, a second protective layer PL2, a light shielding pattern SP, a red color filter CFR, a green color filter CFG, a blue color filter CFB, and a third substrate SUB3.

The first transistor TFT1 may include a first active layer ACT1, a first gate electrode GATE1, a first source electrode S1, and a first drain electrode D1. The second transistor TFT2 may include a second active layer ACT2, a second gate electrode GATE2, a second source electrode S2, and a second drain electrode D2. The third transistor TFT3 may include a third active layer ACT3, a third gate electrode GATE3, a third source electrode S3, and a third drain electrode D3.

According to some embodiments, the first substrate SUB1 may include polyimide. In this case, a thickness of the first substrate SUB1 may be approximately 2 to 10 micrometers. The first substrate SUB1 may include an opening OP. A conductive connection member may be located in the opening OP. For example, the anisotropic conductive film ACF may be located in the opening OP. The anisotropic conductive film ACF may include a conductive ball SB. Although the anisotropic conductive film ACF has been shown in FIGS. 3 to 8 as being located in the opening OP, embodiments according to the present disclosure are not limited thereto. For example, silver paste may be located in the opening OP. In addition, various connection members having conductivity may be located in the opening OP.

The circuit board CB may be located under the first substrate SUB1. The circuit board CB may be a printed circuit board (PCB) or a flexible printed circuit board (FPCB). The circuit board CB may be connected to the pad PAD by the anisotropic conductive film ACF. The driver IC may be located on the circuit board CB. A signal may be transmitted from the driver IC to the pad PAD through the anisotropic conductive film ACF.

The first insulating layer IL1 may be located on the first substrate SUB1. The first insulating layer IL1 may include an inorganic insulating material. For example, the first insulating layer IL1 may include silicon oxide ($SiO_x$), silicon nitride ($SiN_x$), and silicon oxynitride ($SiO_xN_y$). The first insulating layer IL1 may prevent moisture from penetrating into the first to third transistors TFT1, TFT2, and TFT3 together with the first substrate SUB1.

The pad PAD may be located on a part of the first insulating layer IL1. A part of the first insulating layer IL1 may be etched to arrange the pad PAD. The pad PAD, the anisotropic conductive film ACF, and the circuit board CB may overlap each other. Accordingly, a signal transmitted to the circuit board CB may be transmitted to the pad PAD through the anisotropic conductive film ACF. A signal transmitted from the pad PAD may be transmitted to the first to third transistors TFT1, TFT2, and TFT3. The signal transmitted from the pad PAD may include various signals for driving the display device. For example, the signal transmitted from the pad PAD may include gate signals transmitted to the gate electrodes of the first to third transistors TFT1, TFT2, and TFT3. In addition, the signal transmitted from the pad PAD may be a data signal transmitted to the light emitting elements ED1, ED2, ED3, and ED4.

The first to third active layers ACT1, ACT2, and ACT3 may be located on the first insulating layer IL1. The first to third active layers ACT1, ACT2, and ACT3 may include an oxide-based semiconductor material. Alternatively, the first to third active layers ACT1, ACT2, and ACT3 may include a silicon-based semiconductor material. Alternatively, some of the first to third active layers ACT1, ACT2, and ACT3 may include an oxide-based semiconductor material, and the rest except for the some of the first to third active layers ACT1, ACT2, and ACT3 may include a silicon-based semiconductor material.

The second insulating layer IL2 may be located on the first insulating layer IL1 to cover the first to third active layers ACT1, ACT2, and ACT3. The second insulating layer IL2 may include an inorganic insulating material. For example, the second insulating layer IL2 may include silicon oxide ($SiO_x$), silicon nitride ($SiN_x$), and silicon oxynitride ($SiO_xN_y$).

The first to third gate electrodes GATE1, GATE2, and GATE3 may be located on the second insulating layer IL2. The first to third gate electrodes GATE1, GATE2, and GATE3 may include a conductive material. The first to third gate electrodes GATE1, GATE2, and GATE3 may receive the gate signals from the pad PAD to activate the first to third active layers ACT1, ACT2, and ACT3, respectively.

The third insulating layer IL3 may be located on the second insulating layer IL2 to cover the first to third gate electrodes GATE1, GATE2, and GATE3. The third insulating layer IL3 may include an inorganic insulating material. For example, the third insulating layer IL3 may include silicon oxide ($SiO_x$), silicon nitride ($SiN_x$), and silicon oxynitride ($SiO_xN_y$).

The first to third source electrodes S1, S2, and S3 and the first to third drain electrodes D1, D2, and D3 may be located on the third insulating layer IL3. The first to third source electrodes S1, S2, and S3 and the first to third drain electrodes D1, D2, and D3 may include a conductive material. The first source electrode S1 and the first drain electrode D1 may be connected to the first active layer ACT1 through contact holes, respectively. The second source electrode S2 and the second drain electrode D2 may be connected to the second active layer ACT2 through contact holes, respectively. The third source electrode S3 and the third drain electrode D3 may be connected to the third active layer ACT3 through contact holes, respectively.

In addition, a first connection electrode C1 and a second connection electrode C2 may be located on the third insulating layer IL3. The first connection electrode C1 may be connected to the pad PAD through a contact hole. The first connection electrode C1 may receive a signal from the pad PAD to transmit the signal to other wires, electrodes, and the like. The second connection electrode C2 may be connected to a transistor. In other words, the second connection electrode C2 may receive a signal from the transistor.

The fourth insulating layer IL4 may be located on the third insulating layer IL3 to cover the first to third source electrodes S1, S2, and S3, the first to third drain electrodes D1, D2, and D3, the first connection electrode C1, and the second connection electrode C2. The fourth insulating layer IL4 may include an inorganic insulating material. For example, the fourth insulating layer IL4 may include silicon oxide ($SiO_x$), silicon nitride ($SiN_x$), and silicon oxynitride ($SiO_xN_y$).

The capping member SEAL may be located on the first insulating layer IL1. The capping member SEAL may be arranged along edges of the second to fourth insulating layers IL2, IL3, and IL4. In other words, the capping member SEAL may be located in the capping area CA surrounding the element area TA. The first to third transistors TFT1, TFT2, and TFT3 may be located in the element area TA.

The capping member SEAL may include at least one selected from a frit, an inorganic material, and glass. The capping member SEAL may prevent moisture from penetrating into the second to fourth insulating layers IL2, IL3, and IL4. Accordingly, the capping member SEAL may prevent the moisture from penetrating into the first to third transistors TFT1, TFT2, and TFT3.

The second substrate SUB2 may be located on the fourth insulating layer IL4 and the capping member SEAL. According to some embodiments, the second substrate SUB2 may include polyimide. In this case, a thickness of the second substrate SUB2 may be approximately 2 to 10 micrometers.

Although both the first substrate SUB1 and the second substrate SUB2 have been described as including polyimide, embodiments according to the present disclosure are not limited thereto. For example, both the first substrate SUB1 and the second substrate SUB2 may include glass.

The fifth insulating layer IL5 may be located on the second substrate SUB2. The fifth insulating layer IL5 may include an inorganic insulating material. For example, the fifth insulating layer IL5 may include silicon oxide ($SiO_x$), silicon nitride ($SiN_x$), and silicon oxynitride ($SiO_xN_y$).

The second substrate SUB2 and the fifth insulating layer IL5 may prevent moisture from penetrating into the first to third transistors TFT1, TFT2, and TFT3. According to some embodiments of the present invention, the first to third transistors TFT1, TFT2, and TFT3 are sealed by the first substrate SUB1, the first insulating layer IL1, the capping member SEAL, the second substrate SUB2, and the fifth insulating layer IL5, so that the first to third transistors TFT1, TFT2, and TFT3 that are vulnerable to moisture or other contaminants may be protected. However, the first to third transistors TFT1, TFT2, and TFT3 may not be located in the capping area CA of the display panel due to the capping member SEAL.

The first to fourth light emitting elements ED1, ED2, ED3, and ED4 may be located on the fifth insulating layer IL5. The first to fourth light emitting elements ED1, ED2, ED3, and ED4 may be connected to transistors, respectively. For example, as shown in FIG. 3, the first light emitting element ED1, the second light emitting element ED2, and the fourth light emitting element ED4 may be connected to the first drain electrode D1, the second drain electrode D2, and the third drain electrode D3, respectively.

The third light emitting element ED3 may be connected to the second connection electrode C2. The second connection electrode C2 may be connected to a drain electrode of the transistor to receive a data signal from the transistor.

According to some embodiments, the first to fourth light emitting elements ED1, ED2, ED3, and ED4 may include a nano light emitting diode (NED). The nano light emitting diode (NED) may include an inorganic light emitting material. For example, the nano light emitting diode (NED) may include gallium nitrate (GaN). However, because the above configuration is provided for illustrative purposes, the nano light emitting diode (NED) may further include various inorganic light emitting materials.

Because the first to fourth light emitting elements ED1, ED2, ED3, and ED4 include an inorganic light emitting material, the first to fourth light emitting elements ED1, ED2, ED3, and ED4 may be more resistant to moisture as compared with light emitting elements including an organic material. Thus, it is unnecessary to arrange the capping member at edges of the first to fourth light emitting elements ED1, ED2, ED3, and ED4. Therefore, the first to fourth light emitting elements ED1, ED2, ED3, and ED4 may be located in a wider area as compared with the first to third transistors TFT1, TFT2, and TFT3. In other words, the first to fourth light emitting elements ED1, ED2, ED3, and ED4 may be located in the element area TA and the capping area CA surrounding the element area TA.

The first separation walls SW1 may be located on the fifth insulating layer IL5. The first to fourth light emitting elements ED1, ED2, ED3, and ED4 may be spaced apart from each other by the separation walls SW1. In other words, the first separation walls SW1 may serve to partition the first to fourth light emitting elements ED1, ED2, ED3, and ED4. The first separation walls SW1 may include a polymer compound. The first separation walls SW1 may reflect a light emitted by the first to fourth light emitting elements ED1, ED2, ED3, and ED4 to allow the light to be emitted to the outside of the display device.

The encapsulation layer EC may be located on the first separation walls SW1. The encapsulation layer EC may be located on the first separation walls SW1 to prevent foreign substances from penetrating into the first to fourth light emitting elements ED1, ED2, ED3, and ED4. According to some embodiments, the encapsulation layer EC may be configured as a single layer. Alternatively, according to some embodiments, the encapsulation layer EC may have a structure in which an organic material and an inorganic material are stacked.

For example, the organic material may include a cured polymer such as polyacrylate. For example, the cured polymer may be formed by a crosslinking reaction of a monomer. For example, the inorganic material may include silicon oxide, silicon nitride, silicon carbide, aluminum oxide, tantalum oxide, hafnium oxide, zirconium oxide, titanium oxide, and the like.

The filling layer FL may be located on the encapsulation layer EC. The filling layer FL may include an organic material such as a silicon-based resin and an epoxy-based resin. In addition, the filling layer FL may include a material that is appropriate for refractive index matching.

A color conversion layer configured to convert a wavelength of each of lights L1, which have the same color and are emitted from the light emitting elements ED1, ED2, ED3, and ED4, respectively, to emit a light having a color different from a color of an incident light L1 may be located on the filling layer FL. In addition, a color filter layer overlapping the color conversion layer may be located on the filling layer FL.

The third substrate SUB3 may be located on a top of the display device. According to some embodiments, the third substrate SUB3 may include polyimide. In addition, according to some embodiments, the third substrate SUB3 may include glass.

The color filter layer may be located between the third substrate SUB3 and the color conversion layer. The color filter layer may transmit a light having a specific color by filtering a light passing through the color filter layer.

According to some embodiments, the color filter layer may include a red color filter CFR, a green color filter CFG, and a blue color filter CFB. The color filters may overlap emission areas corresponding to the color filters. Therefore, colors of lights L2R, L2B, and L2G emitted from the emission areas may be determined by the color filter layer.

According to some embodiments, the blue color filter CFB may transmit a blue light. The green color filter CFG may transmit a green light. The red color filter CFR may transmit a red light. Although the green color filter CFG has been shown in FIG. 3 as being located between the red color filter CFR and the blue color filter CFB, embodiments according to the present disclosure are not limited thereto. For example, the red color filter CFR may be located between the green color filter CFG and the blue color filter CFB.

The color filter layer may include the light shielding pattern SP that overlaps at least a part of the second separation walls SW2. The light shielding pattern SP may be formed on the same layer as the blue color filter CFB, and may be connected to the blue color filter CFB. According to some embodiments, the light shielding pattern SP may serve to prevent color mixture between the emission areas.

The second protective layer PL2 may be located between the color filter layer and the color conversion layer. The second protective layer PL2 may cover the color filter layer. The second protective layer PL2 may include an inorganic insulating material such as silicon oxide ($SiO_x$), silicon nitride ($SiN_x$), and silicon oxynitride ($SiO_xN_y$).

The color conversion layer may include the red conversion part RC, the green conversion part GC, and the color compensation part CC.

The red conversion part RC may be located in an area in which a red light L2R is emitted. The red conversion part RC may include a resin part RC1, a scattering body RC2, and a wavelength conversion particle RC3.

For example, the wavelength conversion particle RC3 may include a quantum dot. The quantum dot may be defined as a semiconductor material having a nanocrystal. The quantum dot may have a specific band gap according to a composition and a size. Therefore, the quantum dot may absorb an incident light to emit a light having a wavelength that is different from a wavelength of the incident light. For example, the quantum dot may have a diameter of 100 nm or less, and may have a diameter of 1 nm to 20 nm according to some embodiments.

For example, the quantum dot may include a group II-VI compound, a group III-V compound, a group IV-VI compound, a group IV element, a group IV compound, and a combination thereof.

For example, the group II-VI compound may be selected from the group consisting of: a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

For example, the group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

For example, the group IV-VI compound may be selected from the group consisting of: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixtures thereof; and a quaternary element compound selected from the group consisting of SnPbSSe, SnPbSeTe, SnPbSTe, and a mixture thereof.

For example, the group IV element may be selected from the group consisting of Si, Ge, and a mixture thereof. The group IV compound may be a binary compound selected from the group consisting of SiC, SiGe, and a mixture thereof.

For example, the quantum dot may have a core/shell structure including a core and a shell surrounding the core. For example, the core and the shell may include mutually different materials.

The quantum dots may be dispersed in the resin part RC1. For example, the resin part RC1 may include an epoxy-based resin, an acryl-based resin, a phenol-based resin, a melamine-based resin, a cardo-based resin, an imide-based resin, and the like.

The scattering body RC2 may scatter a light incident on the red conversion part RC to increase an optical path without substantially changing a wavelength of the incident light.

The scattering body RC2 may include metal oxide or an organic material. For example, the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like, and the organic material may include an acryl-based resin or a urethane-based resin.

For example, the light emitting elements ED1 and ED4 corresponding to the red light L2R may emit a blue light L1 having a peak wavelength within a range of approximately 440 nm to approximately 480 nm. The red conversion part RC may excite an incident blue light L1 to emit the red light L2R. The blue light L1 that has not been excited by the red conversion part RC may be blocked by the red color filter CFR. Therefore, areas corresponding to the first and fourth light emitting elements ED1 and ED4 may emit the red light L2R. For example, the red light L2R may have a peak wavelength within a range of approximately 610 nm to 650 nm.

The green conversion part GC may be located in an area in which a green light L2G is emitted. The green conversion part GC may include a resin part GC1, a scattering body GC2, and a wavelength conversion particle GC3.

For example, the light emitting element ED2 corresponding to the green light L2G may emit a blue light L1 having a peak wavelength within a range of approximately 440 nm to approximately 480 nm. The green conversion part GC may excite an incident blue light L1 to emit the green light L2G. The blue light L1 that has not been excited by the green conversion part GC may be blocked by the green color filter CFG. Therefore, an area corresponding to the second light emitting element ED2 may emit the green light L2G. For example, the green light L2G may have a peak wavelength within a range of approximately 510 nm to 550 nm.

The color compensation part CC may be located in an area in which a blue light L2B is emitted. The color compensation part CC may not include a wavelength conversion material. When the third light emitting element ED3 emits the blue light L1, the blue light L1 may pass through the color compensation part CC without wavelength conversion so as to be incident onto the blue color filter CFB. Therefore, an area corresponding to the third light emitting element ED3 may emit the blue light L2B.

The color compensation part CC may include a resin part CC1. For example, the resin part CC1 may include the same resin as the resin parts RC1 and GC1. In addition, the color compensation part CC may further include a scattering body CC2.

According to some embodiments, the color compensation part CC may further include a wavelength conversion material to improve color quality and increase color conversion efficiency. For example, the wavelength conversion material may excite an ultraviolet ray or a light within a wavelength range that is close to a wavelength range of the ultraviolet ray to emit a blue light.

The second separation wall SW2 may surround a side surface of each of the red conversion part RC, the green conversion part GC, and the color compensation part CC. The second separation wall SW2 may form a space for accommodating an ink composition in a process of forming the red conversion part RC, the green conversion part GC, and the color compensation part CC. Therefore, the second separation wall SW2 may have a grid shape or a matrix shape on a plan view.

For example, the second separation wall SW2 may include an organic material such as an epoxy-based resin, a phenol-based resin, an acryl-based resin, and a silicon-based resin.

According to some embodiments, the second separation wall SW2 may include a light shielding material to serve as a black matrix. For example, at least a part of the second separation wall SW2 may include a light shielding material such as a pigment, a dye, and carbon black.

The second separation wall SW2 may have a single-layer structure or a multilayer structure. For example, the second separation wall SW2 may be designed to have a predetermined thickness or more in order to serve as a separation wall for accommodating an ink composition. To this end, a separation wall having a multilayer structure may be formed.

The first protective layer PL1 may be located between the color conversion layer and the filling layer FL. The first protective layer PL1 may include an inorganic insulating material such as silicon oxide ($SiO_x$), silicon nitride ($SiN_x$), and silicon oxynitride ($SiO_xN_y$).

Figure 4:
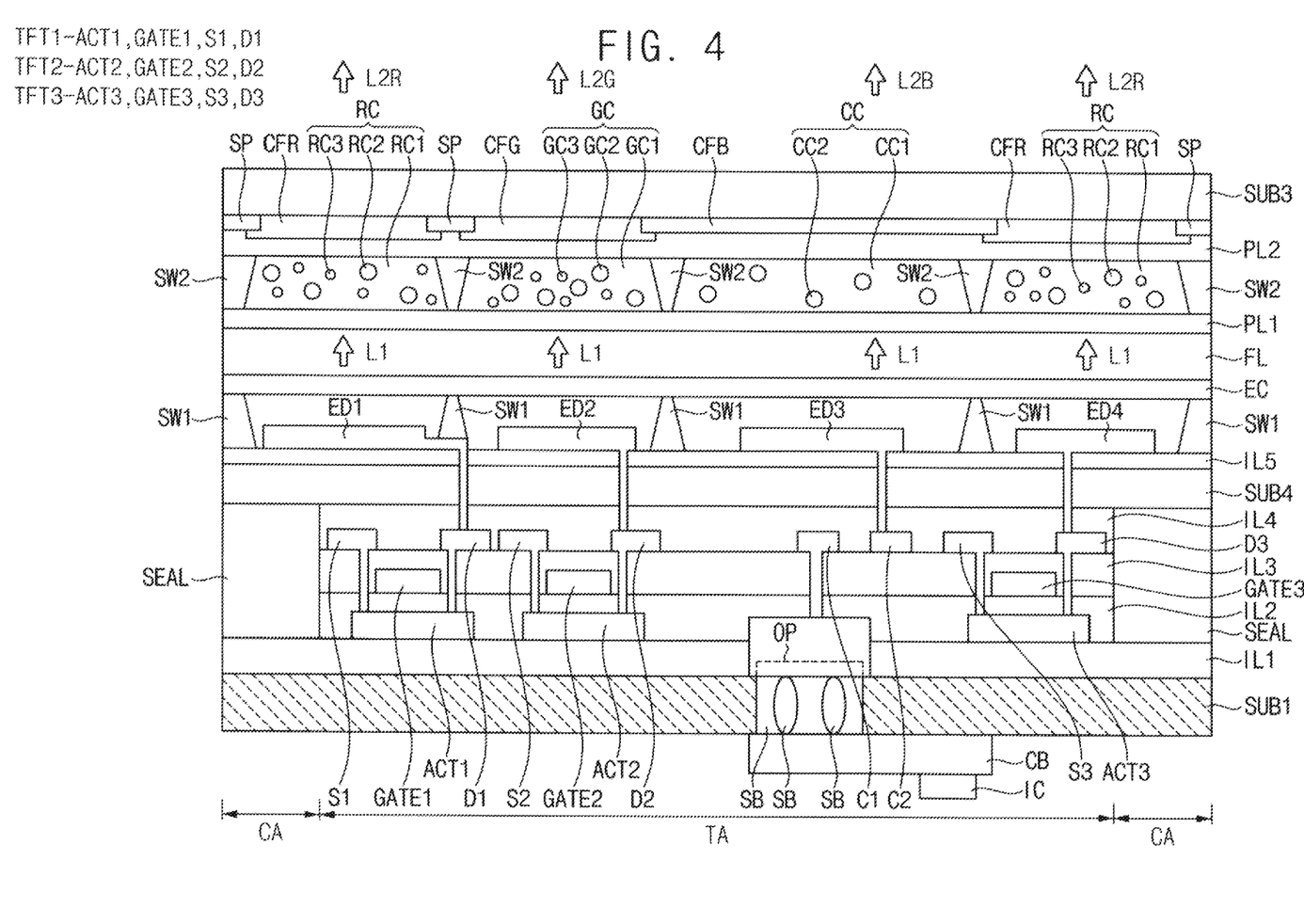
FIG. 4 is a sectional view showing a display device according to some embodiments of the present invention.

FIG. 4 is a sectional view showing a display device according to some embodiments of the present invention. FIG. 4 may be substantially the same as FIG. 3 except for the second substrate SUB2 of FIG. 3. Accordingly, descriptions of some redundant components may be omitted.

Referring to FIG. 4, a display device may include a driver IC, a circuit board CB, a first substrate SUB1, a first insulating layer IL1, an anisotropic conductive film ACF, a pad PAD, a capping member SEAL, a first transistor TFT1, a second transistor TFT2, a third transistor TFT3, a second insulating layer IL2, a third insulating layer IL3, a fourth insulating layer IL4, a fourth substrate SUB4, a fifth insulating layer IL5, a first light emitting element ED1, a second light emitting element ED2, a third light emitting element ED3, a fourth light emitting element ED4, a first separation wall SW1, an encapsulation layer EC, a filling layer FL, a first protective layer PL1, a second separation wall SW2, a red conversion part RC, a green conversion part GC, a color compensation part CC, a second protective layer PL2, a light shielding pattern SP, a red color filter CFR, a green color filter CFG, a blue color filter CFB, and a third substrate SUB3.

The first transistor TFT1 may include a first active layer ACT1, a first gate electrode GATE1, a first source electrode S1, and a first drain electrode D1. The second transistor TFT2 may include a second active layer ACT2, a second gate electrode GATE2, a second source electrode S2, and a second drain electrode D2. The third transistor TFT3 may include a third active layer ACT3, a third gate electrode GATE3, a third source electrode S3, and a third drain electrode D3.

According to some embodiments, the fourth substrate SUB4 may be located under the fifth insulating layer IL5 to cover the capping member SEAL and the fourth insulating layer IL4. According to some embodiments, the fourth substrate SUB4 may include a glass material. For example, the fourth substrate SUB4 may include a rigid material such as silicon dioxide ($SiO_2$). Accordingly, the first substrate SUB1 and the fourth substrate SUB4 that surround the first to third transistors TFT1, TFT2, and TFT3 may include mutually different materials.

Figure 5:
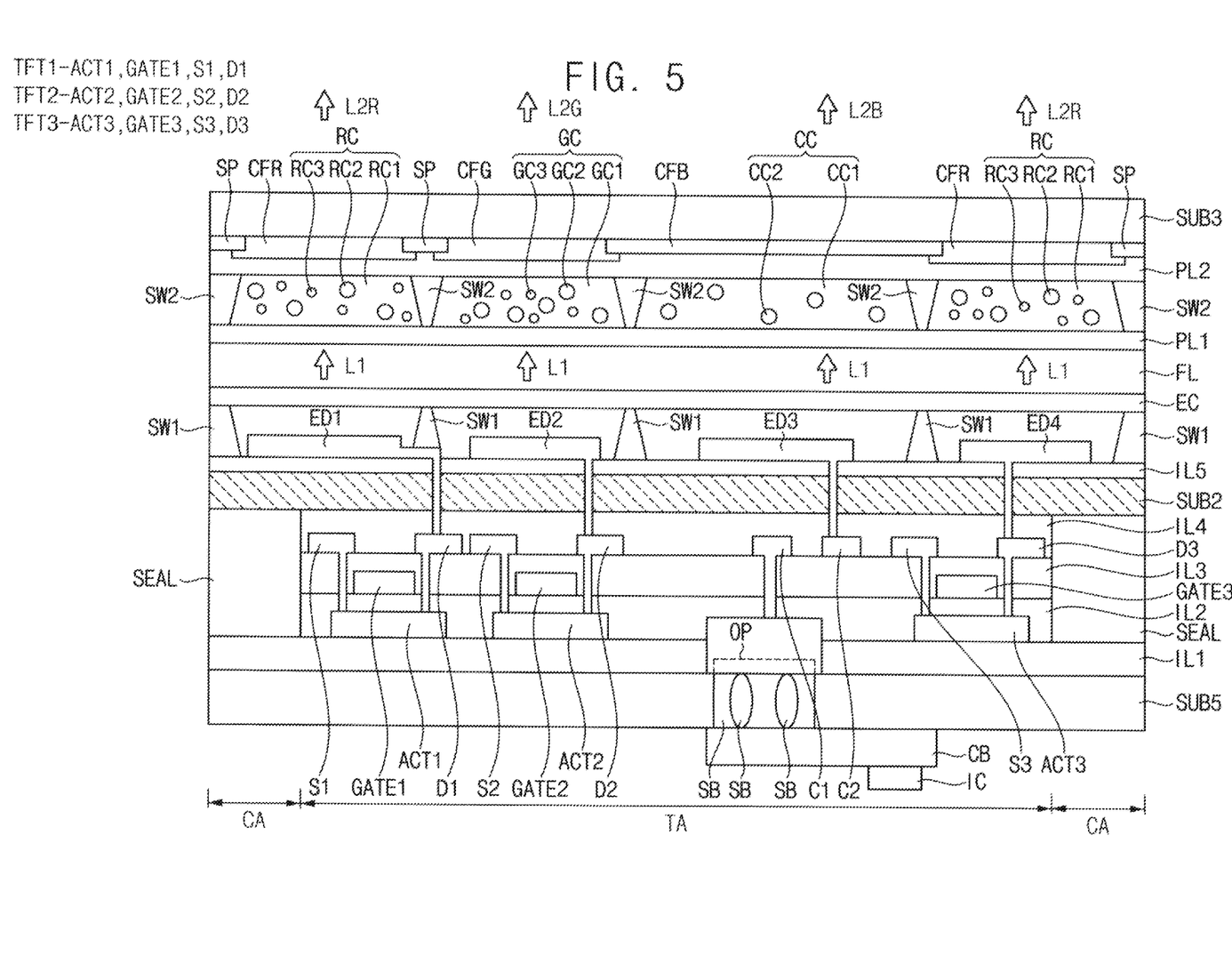
FIG. 5 is a sectional view showing a display device according to some embodiments of the present invention.

FIG. 5 is a sectional view showing a display device according to some embodiments of the present invention. FIG. 5 may be substantially the same as FIG. 3 except for the first substrate SUB1 of FIG. 3. Accordingly, descriptions of redundant components may be omitted.

Referring to FIG. 5, a display device may include a driver IC, a circuit board CB, a fifth substrate SUB5, a first insulating layer IL1, an anisotropic conductive film ACF, a pad PAD, a capping member SEAL, a first transistor TFT1, a second transistor TFT2, a third transistor TFT3, a second insulating layer IL2, a third insulating layer IL3, a fourth insulating layer IL4, a second substrate SUB2, a fifth insulating layer IL5, a first light emitting element ED1, a second light emitting element ED2, a third light emitting element ED3, a fourth light emitting element ED4, a first separation wall SW1, an encapsulation layer EC, a filling layer FL, a first protective layer PL1, a second separation wall SW2, a red conversion part RC, a green conversion part GC, a color compensation part CC, a second protective layer PL2, a light shielding pattern SP, a red color filter CFR, a green color filter CFG, a blue color filter CFB, and a third substrate SUB3.

The first transistor TFT1 may include a first active layer ACT1, a first gate electrode GATE1, a first source electrode S1, and a first drain electrode D1. The second transistor TFT2 may include a second active layer ACT2, a second gate electrode GATE2, a second source electrode S2, and a second drain electrode D2. The third transistor TFT3 may include a third active layer ACT3, a third gate electrode GATE3, a third source electrode S3, and a third drain electrode D3.

According to some embodiments, the fifth substrate SUB5 may be located on a bottom of the display device. The fifth substrate SUB5 may be located between the first insulating layer IL1 and the circuit board CB. According to some embodiments, the fifth substrate SUB5 may include a glass material. For example, the fifth substrate SUB5 may include a rigid material such as silicon dioxide ($SiO_2$). Accordingly, the second substrate SUB2 and the fifth substrate SUB5 that surround the first to third transistors TFT1, TFT2, and TFT3 may include mutually different materials.

Figure 6:
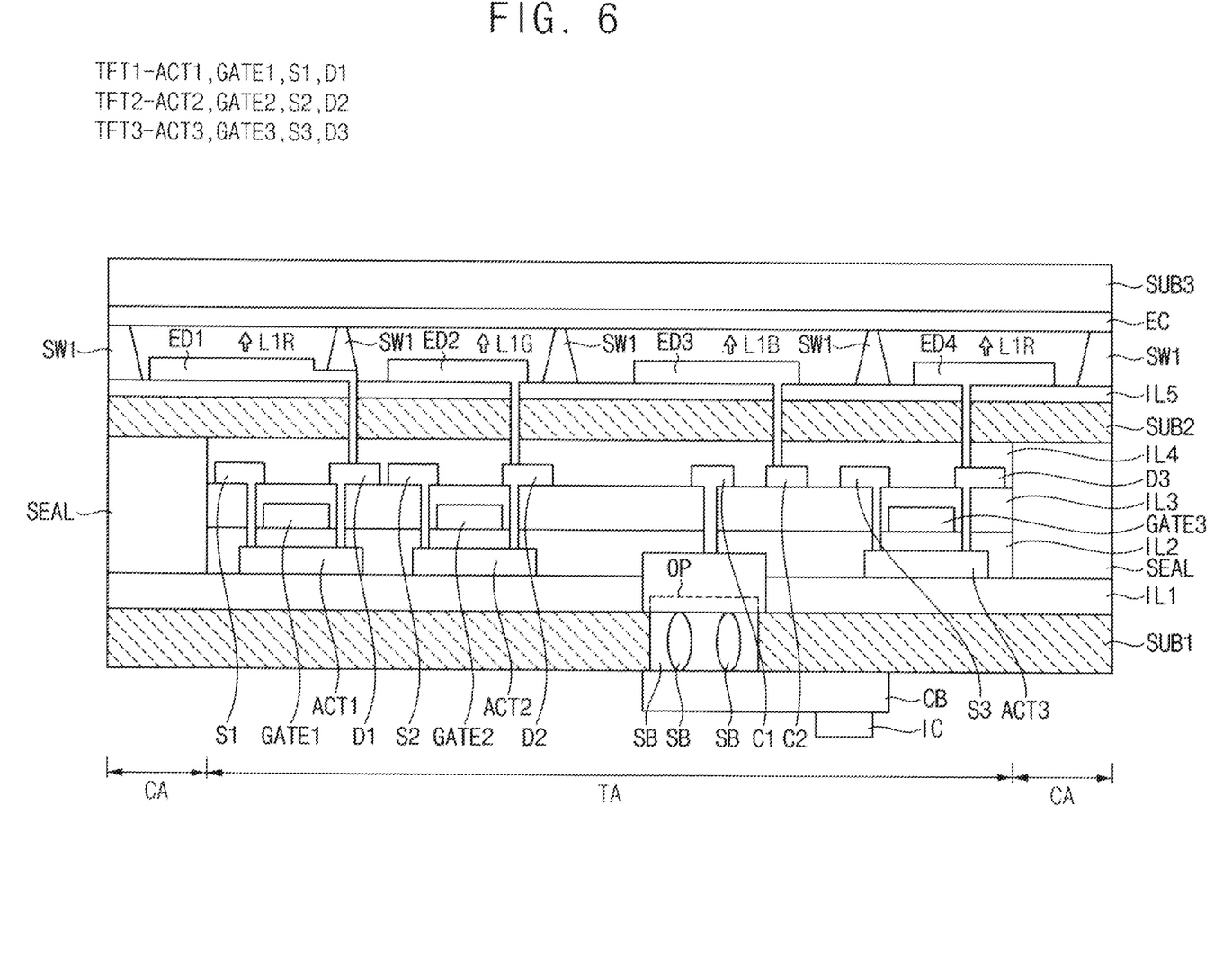
FIG. 6 is a sectional view showing a display device according to some embodiments of the present invention.

FIG. 6 is a sectional view showing a display device according to some embodiments of the present invention. FIG. 6 may be substantially the same as FIG. 3 except that some components of FIG. 3 are excluded. Accordingly, descriptions of redundant components may be omitted.

Referring to FIG. 6, a display device may include a driver IC, a circuit board CB, a first substrate SUB1, a first insulating layer IL1, an anisotropic conductive film ACF, a pad PAD, a capping member SEAL, a first transistor TFT1, a second transistor TFT2, a third transistor TFT3, a second insulating layer IL2, a third insulating layer IL3, a fourth insulating layer IL4, a second substrate SUB2, a fifth insulating layer IL5, a first light emitting element ED1, a second light emitting element ED2, a third light emitting element ED3, a fourth light emitting element ED4, a first separation wall SW1, an encapsulation layer EC, and a third substrate SUB3.

The first transistor TFT1 may include a first active layer ACT1, a first gate electrode GATE1, a first source electrode S1, and a first drain electrode D1. The second transistor TFT2 may include a second active layer ACT2, a second gate electrode GATE2, a second source electrode S2, and a second drain electrode D2. The third transistor TFT3 may include a third active layer ACT3, a third gate electrode GATE3, a third source electrode S3, and a third drain electrode D3.

In some embodiments, each of the first to fourth light emitting elements ED1, ED2, ED3, and ED4 may emit lights having mutually different colors. For example, as shown in FIG. 5, the first light emitting element ED1 may emit a red light L1R, the second light emitting element ED2 may emit a green light L1G, and the third light emitting element ED3 may emit a blue light L1B. Although the fourth light emitting element ED4 has been shown as emitting a red light L1R, embodiments according to the present disclosure are not limited thereto. For example, the fourth light emitting element ED4 may emit a green light L1G or a blue light L1B.

As described above, because the first to fourth light emitting elements ED1, ED2, ED3, and ED4 emit lights having mutually different colors, the display device may not be provided with a color conversion layer, a color filter, and the like. In other words, as shown in FIG. 3, when all the first to fourth light emitting elements ED1, ED2, ED3, and ED4 emit the same blue light L1, components (e.g., the color conversion layer and the color filter) configured to convert a color of the blue light L1 have to be additionally provided. On the contrary, in FIG. 5, the first to fourth light emitting elements ED1, ED2, ED3, and ED4 may emit lights having mutually different colors, so that it is unnecessary to provide the color conversion layer, the color filter, and the like, and thus a thickness of the display device may be reduced.

Figure 7:
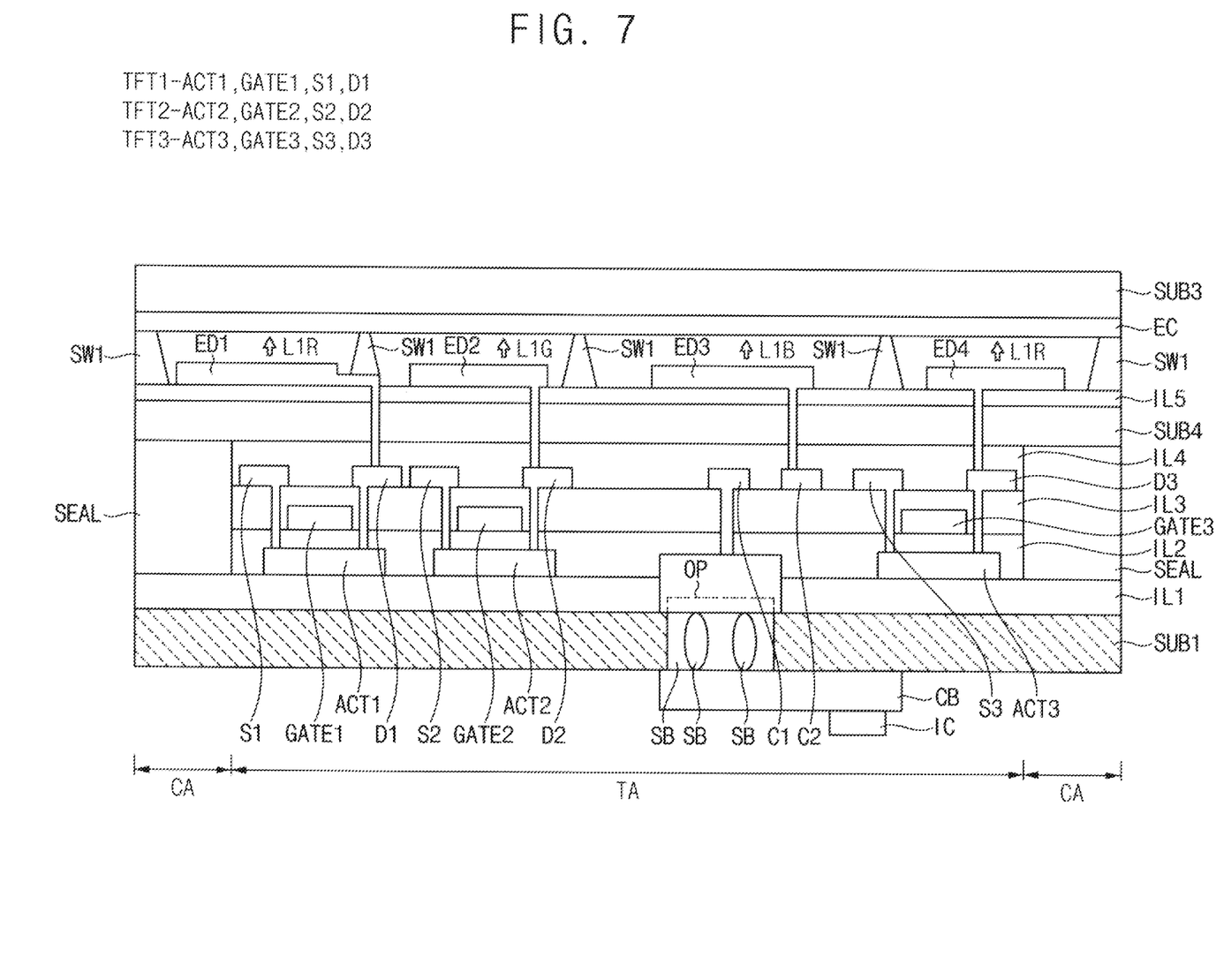
FIG. 7 is a sectional view showing a display device according to some embodiments of the present invention.

FIG. 7 is a sectional view showing a display device according to some embodiments of the present invention. FIG. 7 may be substantially the same as FIG. 6 except for the second substrate SUB2 of FIG. 6. Accordingly, descriptions of redundant components may be omitted.

Referring to FIG. 7, a display device may include a driver IC, a circuit board CB, a first substrate SUB1, a first insulating layer IL1, an anisotropic conductive film ACF, a pad PAD, a capping member SEAL, a first transistor TFT1, a second transistor TFT2, a third transistor TFT3, a second insulating layer IL2, a third insulating layer IL3, a fourth insulating layer IL4, a fourth substrate SUB4, a fifth insulating layer IL5, a first light emitting element ED1, a second light emitting element ED2, a third light emitting element ED3, a fourth light emitting element ED4, a first separation wall SW1, an encapsulation layer EC, and a third substrate SUB3.

The first transistor TFT1 may include a first active layer ACT1, a first gate electrode GATE1, a first source electrode S1, and a first drain electrode D1. The second transistor TFT2 may include a second active layer ACT2, a second gate electrode GATE2, a second source electrode S2, and a second drain electrode D2. The third transistor TFT3 may include a third active layer ACT3, a third gate electrode GATE3, a third source electrode S3, and a third drain electrode D3.

According to some embodiments, the fourth substrate SUB4 may be located under the fifth insulating layer IL5 to cover the capping member SEAL and the fourth insulating layer IL4. According to some embodiments, the fourth substrate SUB4 may include a glass material. For example, the fourth substrate SUB4 may include a rigid material such as silicon dioxide ($SiO_2$). Accordingly, the first substrate SUB1 and the fourth substrate SUB4 that surround the first to third transistors TFT1, TFT2, and TFT3 may include mutually different materials.

Figure 8:
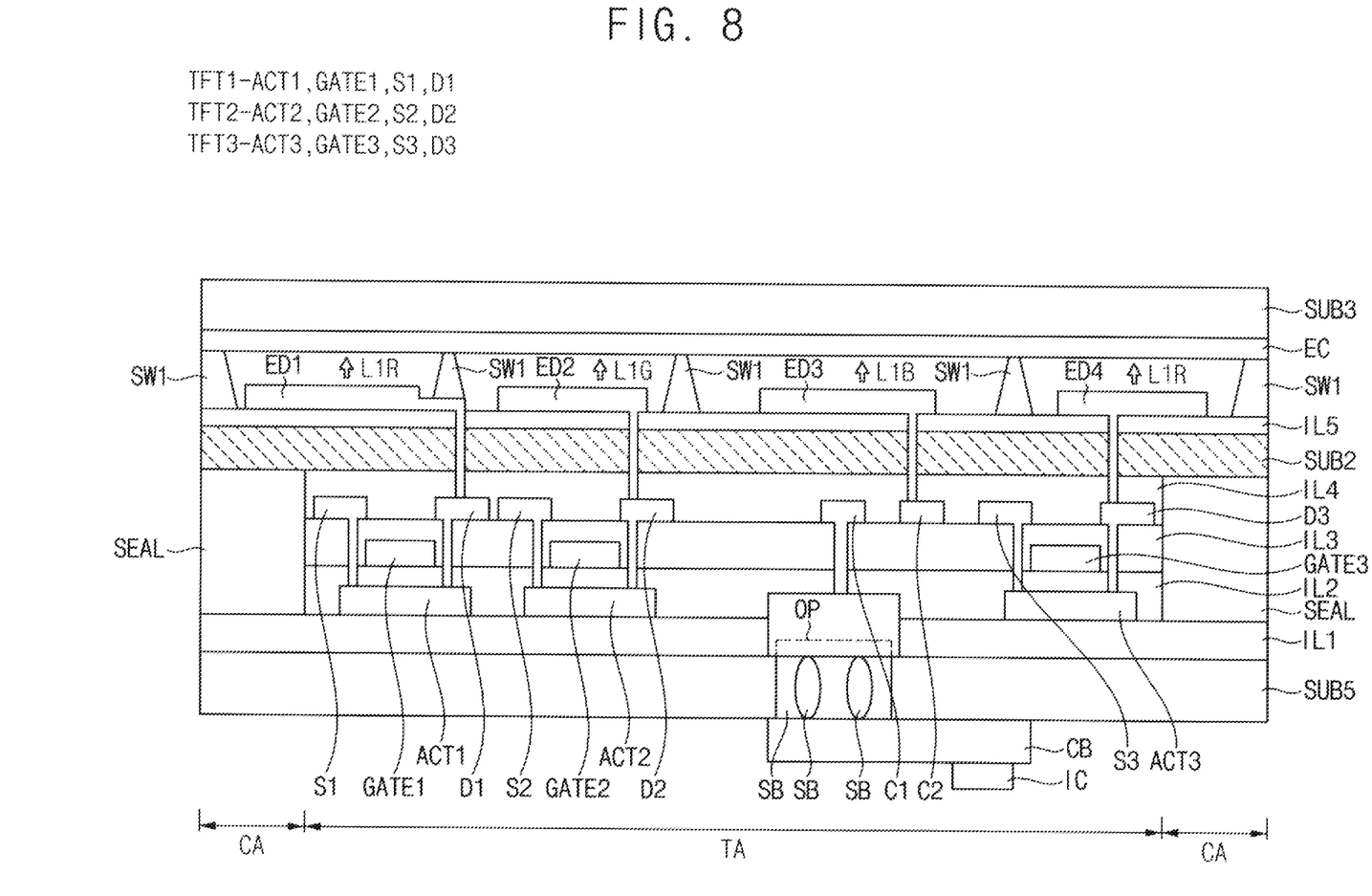
FIG. 8 is a sectional view showing a display device according to some embodiments of the present invention.

FIG. 8 is a sectional view showing a display device according to some embodiments of the present invention. FIG. 8 may be substantially the same as FIG. 6 except for the first substrate SUB1 of FIG. 6. Accordingly, descriptions of redundant components may be omitted.

Referring to FIG. 8, a display device may include a driver IC, a circuit board CB, a fifth substrate SUB5, a first insulating layer IL1, an anisotropic conductive film ACF, a pad PAD, a capping member SEAL, a first transistor TFT1, a second transistor TFT2, a third transistor TFT3, a second insulating layer IL2, a third insulating layer IL3, a fourth insulating layer IL4, a second substrate SUB2, a fifth insulating layer IL5, a first light emitting element ED1, a second light emitting element ED2, a third light emitting element ED3, a fourth light emitting element ED4, a first separation wall SW1, an encapsulation layer EC, and a third substrate SUB3.

The first transistor TFT1 may include a first active layer ACT1, a first gate electrode GATE1, a first source electrode S1, and a first drain electrode D1. The second transistor TFT2 may include a second active layer ACT2, a second gate electrode GATE2, a second source electrode S2, and a second drain electrode D2. The third transistor TFT3 may include a third active layer ACT3, a third gate electrode GATE3, a third source electrode S3, and a third drain electrode D3.

According to some embodiments, the fifth substrate SUB5 may be located on a bottom of the display device. The fifth substrate SUB5 may be located between the first insulating layer IL1 and the circuit board CB. According to some embodiments, the fifth substrate SUB5 may include a glass material. For example, the fifth substrate SUB5 may include a rigid material such as silicon dioxide ($SiO_2$). Accordingly, the second substrate SUB2 and the fifth substrate SUB5 that surround the first to third transistors TFT1, TFT2, and TFT3 may include mutually different materials.

Although aspects of some embodiments of the present invention have been described above, it will be understood by those of ordinary skill in the art that various changes and modifications can be made to the present invention without departing from the idea and scope of embodiments according to the present invention as disclosed in the appended claims and their equivalents.

The present invention may be applied to a display device (e.g., a tiled display device) and the like. For example, the display device may include a smartphone, a tablet, a laptop computer, a monitor, a TV, and the like.

Although aspects of some embodiments of the present invention have been described above, it will be understood by those of ordinary skill in the art that various changes and modifications can be made to the present invention without departing from the idea and scope of embodiments according to the present invention as disclosed in the appended claims and their equivalents.

What is claimed is:

1. A display device comprising:
    a plurality of sub-display panels, wherein each of the sub-display panels comprises:
    a first substrate;
    a plurality of transistors on the first substrate;
    a capping member arranged along an edge of the first substrate to surround the transistors such that the transistors are located in an area where the capping member is not located between internal edges of the capping member that are spaced apart from each other across the area where the capping member is not located;
    a second substrate on the capping member and the transistors; and
    a plurality of light emitting elements on the second substrate and electrically connected to the transistors, respectively.

2. The display device of claim 1, wherein a part of the light emitting elements overlaps the capping member.

3. The display device of claim 1, wherein the light emitting elements include an inorganic light emitting material.

4. The display device of claim 3, wherein the inorganic light emitting material includes gallium nitrate (GaN).

5. The display device of claim 1, wherein the first substrate and the second substrate include polyimide or glass.

6. The display device of claim 1, wherein one substrate among the first substrate and the second substrate includes polyimide, and
    a remaining substrate other than the one substrate, from among the first and second substrates includes glass.

7. The display device of claim 1, wherein each of the sub-display panels further includes a circuit board under the first substrate and including a driver.

8. The display device of claim 7, wherein the first substrate includes an opening area, and
    each of the sub-display panels further includes a conductive connection member at least partially in the opening area and configured to electrically connect the circuit board to the transistors.

9. The display device of claim 1, wherein the light emitting elements emit a light having a same color.

10. The display device of claim 9, wherein each of the sub-display panels further includes:
    a color conversion layer on the light emitting elements and including a color conversion part and a color compensation part; and
    a color filter layer on the color conversion layer.

11. The display device of claim 10, wherein the color conversion layer includes a wavelength conversion particle configured to excite an incident light to emit a light having a color that is different from a color of the incident light, and
    the color filter layer is configured to filter the light emitted from the color conversion layer.

12. The display device of claim 10, wherein each of the sub-display panels further includes a third substrate on the color filter layer.

13. The display device of claim 12, wherein the third substrate includes polyimide or glass.

14. The display device of claim 1, wherein the light emitting elements emit lights having mutually different colors.

15. The display device of claim 14, wherein each of the sub-display panels further includes a third substrate on the light emitting elements.

16. The display device of claim 15, wherein the third substrate includes polyimide or glass.

17. The display device of claim 1, wherein each of the sub-display panels further includes an inorganic insulating layer between the first substrate and the transistors.

18. The display device of claim 1, wherein each of the sub-display panels further includes an inorganic insulating layer between the second substrate and the light emitting elements.

19. The display device of claim 1, wherein each of the first substrate and the second substrate has a thickness of 2 to 10 micrometers.

20. The display device of claim 1, wherein the capping member includes at least one selected from a frit, an inorganic material, and glass.

* * * * *